United States Patent [19]

Ohbayashi

[11] Patent Number: 4,997,515

[45] Date of Patent: Mar. 5, 1991

[54] METHOD OF SYNTHESIZING SINGLE-CRYSTAL KTiOPO$_4$

[75] Inventor: Yasushi Ohbayashi, Shizuoka, Japan

[73] Assignee: Hamamatsu Photonics K.K., Shizuoka, Japan

[21] Appl. No.: 430,272

[22] Filed: Nov. 2, 1989

[30] Foreign Application Priority Data

Dec. 12, 1988 [JP] Japan ................... 63-312078

[51] Int. Cl.$^5$ .................. C30B 29/14; C30B 17/00
[52] U.S. Cl. .................. 156/616.1; 156/617.1; 156/620.2; 156/DIG. 75; 156/DIG. 78; 423/306
[58] Field of Search ............. 156/DIG. 75, DIG. 78, 156/617.1, 620.2, 624, 616.3; 423/305, 306, 84, 85, 69, 179; 501/46

[56] References Cited

U.S. PATENT DOCUMENTS

| | | | |
|---|---|---|---|
| 4,231,838 | 11/1980 | Gier | 156/DIG. 105 |
| 4,746,396 | 5/1988 | Marnier | 156/624 |
| 4,761,202 | 8/1988 | Bordui et al. | 156/624 |

FOREIGN PATENT DOCUMENTS

| | | | |
|---|---|---|---|
| 56-5400 | 1/1981 | Japan . | |
| 62-27314 | 2/1987 | Japan . | |
| 63-40713 | 2/1988 | Japan . | |
| 63-40799 | 2/1988 | Japan . | |
| 2200622 | 8/1988 | United Kingdom | 156/624 |

OTHER PUBLICATIONS

Jacobson, *Encylopedia of Chemical Reactions,* Reinhold Publishing Corporation, 1953, p. 585.
Olsen, *Unit Processes and Principles of Chemical Engineering,* D. Van Nostrand Co., pp. 1-3, 1932.
A. A. Ballman et al., Growth of Potassium Titanyl Phosphate (KTP) from Molten Tungstate Melts; Journal of Crystal Growth, 75 (1986), 390-394.
P. F. Bourdi et al., Growth of Large Single Crystals of KTiOPO$_4$ (KTP) from High-Temperature Solution Using Heat Pipe Based Furnace System; Journal of Crystal Growth, 84 (1987), 403-408.
J. C. Jacco et al., Flux Growth and Properties of KTiOPO$_4$; Journal of Crystal Growth, 70 (1984), 484-488.

*Primary Examiner*—Gary P. Straub
*Assistant Examiner*—Stephen G. Kalinchak
*Attorney, Agent, or Firm*—Finnegan, Henderson, Farabow, Garrett and Dunner

[57] ABSTRACT

Single-crystal KTiOPO$_4$ is synthesized by a method that includes using KH$_2$PO$_4$, K$_2$CO$_3$, and TiO$_2$ as starting materials and using WO$_3$ as a flux material. These materials are mixed together, are reacted, and then are slowly cooled while the single crystal of KTiOPO$_4$ is grown and/or pulled, from a seed crystal, in the Czochralski manner, the Kyropoulous manner, or the so-called solution lift-off manner. Typical cooling rates are about 2° C. per day or 3° C. per day during growth, but can be as much as 5° C. per day.

4 Claims, No Drawings

METHOD OF SYNTHESIZING SINGLE-CRYSTAL KTiOPO₄

BACKGROUND OF THE INVENTION

1. Field of the Invention

The present invention relates to a method of synthesizing single-crystal $KTiOPO_4$ by a flux process.

$KTiOPO_4$ (KTP) conventionally has been prepared by a hydrothermal method of synthesis. This method requires a high pressure of at least 1,000 atm to achieve growth, and thus requires special and expensive apparatus. Moreover, the use of water presents the added problem that optical transparency of $KTiOPO_4$ is reduced because of absorption by the OH groups contributed by the water.

As an alternative to the hydrothermal method, growth by a convenient flux method was very recently studied. While several approaches have been proposed, Bell Telephone Laboratories announced a promising technique in 1986. According to their method, potassium phosphate is mixed with titanium oxide and tungsten oxide (the latter as a flux to promote fusion of the remaining materials), and the mixture is heated to about 1,000° C. $3K_2WO_4 \cdot P_2O_5$ forms in the flux by the following reaction:

$$4K_2HPO_4 + 2TiO_2 + 3WO_3 \rightarrow 2KTiOPO_4 + 3K_2WO_4 \cdot P_2O_5 + 2H_2O \uparrow \quad (1)$$

When the resulting solution is slowly cooled, $KTiOPO_4$ will form by itself.

Another version of the flux method is described in the specification of unexamined published Japanese Patent Application No. 62-27314. According to this method, a crucible placed in a furnace is charged either with a mixture of titanium oxide and oxides of components of the intended compound, or with precursors of these oxides or salts thereof, or with a previously synthesized compound of the KTP type. The charged mixture or compound is heated to a given temperature in the range of from about 650° C. to about 1,100° C. so as to dissolve the mixture or compound in at least one alkali metal halide to be introduced into the crystal. Subsequently, the crucible is cooled almost to room temperature at a rate no faster than about 50° C. per hour. The formed glass crystal is then separated from the reaction mixture.

The methods described above present various problems. These problems relate to contamination by the flux or to low purity of starting materials.

SUMMARY OF THE INVENTION

Accordingly, it is an object of the invention to provide a method of producing $KTiOPO_4$ of high purity.

It is another object of the invention to provide a method of producing $KTiOPO_4$ very simply.

The objects given above are accomplished by using $KH_2PO_4$, $K_2CO_3$, and $TiO_2$ as starting materials and $WO_3$ as a flux material, mixing these materials at a molar ratio of 4:2:2:3, reacting the mixture at about 1,000° C., and slowly cooling the mixture to have a single crystal of $KTiOPO_4$ grow. Additional objects and advantages of the present invention will be set forth in part in the description that follows and in part will be obvious from the description or may be learned by practice of the invention. The objects and advantages of the invention may be realized and obtained by the methods particularly pointed out in the appended claims.

To achieve the objects and in accordance with the purpose of the invention, as embodied and as broadly described herein, a method of synthesizing single-crystal $KTiOPO_4$ comprises the steps of mixing starting materials $KH_2PO_4$, $K_2CO_3$, and $TiO_2$ and a flux material comprising $WO_3$, reacting the mixture within a furnace at a first temperature, cooling the furnace at a first rate until crystal growth is substantially achieved, and further cooling the furnace at a second rate, to a second temperature.

DESCRIPTION OF THE PREFERRED EMBODIMENT

Reference will now be made in detail to the presently preferred embodiment of the invention, an example of which is illustrated below.

As starting materials, $KH_2PO_4$, $K_2CO_3$, and $TiO_2$ are used. In addition, $WO_3$ is used as a flux material. Each of these materials should have a purity of at least 99.999%. Conventionally, $K_2HPO_4$ has been used as a starting material; however, a $KH_2PO_4$ powder having a purity of at least 99.999% is easier to obtain than a $K_2HPO_4$ powder of comparable purity. All of the powders of these materials are mixed at a molar ratio of 4:2:2:3.

The powders are loaded as a charge into a platinum crucible at atmospheric pressure and are heated to about 1,000° C. Normally, $KTiOPO_4$ will decompose at about 1,100° C., but when the four starting materials react, the mixture will melt at a lower temperature than the melting point of $KTiOPO_4$ alone. As long as the mixture is reacting, it should remain heated. The reaction usually lasts 5 to 6 hours.

Once the reaction stops, the temperature in the electric furnace is slowly lowered at atmospheric pressure. When a seed crystal of $KTiOPO_4$ is used, the furnace temperature is lowered by 2° C. to 5° C. per day so as to achieve crystal growth over 5 days. After the 5 days, the furnace temperature is lowered to ambient temperature, which should be reached in about 2 days.

Under this method, single-crystal $KTiOPO_4$ will grow; and heavy $K_2WO_4 \cdot P_2O_5$ of glass phase will precipitate. The described reactions are represented by the following equations:

$$2KH_2PO_4 + K_2CO_3 \rightarrow 2K_2HPO_4 + CO_2 \uparrow + H_2O \uparrow$$

producing high-purity $K_2HPO_4$;

$$4KH_2PO_4 + 2K_2CO_3 + 2TiO_2 + 3WO_3 \rightarrow 2KTiOPO_4 + 3K_2WO_4 \cdot P_2O_5 + 2CO_2 + 4H_2O \quad (2)$$

According to the preferred synthesis method of the present invention, $KTiOPO_4$ is grown, or pulled, from its seed crystal. Therefore, the growth of the crystal can be controlled effectively so as to produce single-crystal $KTiOPO_4$ of high quality. Since the flux method can be performed at atmospheric pressure, a common growth furnace such as the one employed in the Czochralski process may be used. Moreover, crystal growth can be accomplished either by the Kyropoulous method or by the TSSG method. The Kyropoulous method involves immersing the seed crystal in a melt and cooling it at a rate of about 2° C. to 3° C. per day. The TSSG, or solution lift-off method is the combination of the Kyropoulous method and a pulling operation. An experiment by the Kyropoulous method showed that a desired KTiOPO$_4$ crystal of a size of about 15×15×7 mm could be obtained in about 1 week.

It will be apparent to those skilled in the art that modifications and variations can be made to the synthesizing method of the present invention. The invention in its broader aspects is, therefore, not limited to the specific details, representative methods and apparatus, and illustrated examples shown and described herein. Thus, it is intended that all matter contained in the foregoing description shall be interpreted as illustrative and not in a limiting sense.

For example, while the steps of the process can advantageously be performed at atmospheric pressure, that parameter is relatively uncritical, as compared to the conventional hydrothermal synthesis.

What is claimed is:

1. A method of synthesizing single-crystal KTiOPO$_4$, the method comprising the steps of:

mixing starting materials KH$_2$PO$_4$, K$_2$CO$_3$, and TiO$_2$ and a flux material comprising WO$_3$;
   reacting the mixture within a furnace at a first temperature;
   cooling the furnace at a first rate of 2° C. to 5° C. per day to synthesize said single-crystal; and
   further cooling the furnace at a second rate to ambient temperature.

2. The method as recited in claim 1, further including the step of introducing a seed crystal of KTiOPO$_4$ before the cooling step.

3. The method as recited in claim 1 where the starting materials and the flux material have a purity of at least 99.999%.

4. The method as recited in claim 1 where said starting materials and said flux materials are mixed in the following molar ratios:

$$4KH_2PO_4 : 2K_2CO_3 : 2TiO_2 : 3WO_3.$$

* * * * *